US011340669B2

(12) United States Patent
Liao et al.

(10) Patent No.: US 11,340,669 B2
(45) Date of Patent: May 24, 2022

(54) DUSTPROOF DEVICE FOR LAPTOPS

(71) Applicant: CLEVO Co., New Taipei (TW)

(72) Inventors: Wei-Cheng Liao, New Taipei (TW); Po-Hsuan Chen, New Taipei (TW)

(73) Assignee: CLEVO CO., New Taipei (TW)

( * ) Notice: Subject to any disclaimer, the term of this patent is extended or adjusted under 35 U.S.C. 154(b) by 0 days.

(21) Appl. No.: 16/921,982

(22) Filed: Jul. 7, 2020

(65) Prior Publication Data

US 2021/0096617 A1 Apr. 1, 2021

(30) Foreign Application Priority Data

Sep. 26, 2019 (TW) .................................. 108212750

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01)

(58) Field of Classification Search
CPC ....... G06F 1/203; G06F 1/20; H05K 7/20145; H05K 7/20172; H05K 7/20909;
(Continued)

(56) References Cited

U.S. PATENT DOCUMENTS

| 7,802,617 B2 * | 9/2010 | Hwang | G06F 1/20 165/122 |
| 8,256,495 B2 * | 9/2012 | Hattori | G06F 1/203 165/11.1 |
| 8,534,998 B2 * | 9/2013 | Liang | F04D 29/4246 415/182.1 |
| 10,539,150 B2 * | 1/2020 | Ling | F04D 29/282 |

(Continued)

FOREIGN PATENT DOCUMENTS

| CN | 204226276 U | * | 3/2015 |
| CN | 107023517 A | * | 8/2017 |

OTHER PUBLICATIONS

Lin et al., Fan Module and Electronic Device, 2017, PE2E search engine, CN107023517 translation (Year: 2017).*

(Continued)

*Primary Examiner* — Michael A Matey
(74) *Attorney, Agent, or Firm* — Bacon & Thomas, PLLC

(57) ABSTRACT

A dustproof device for laptops comprises a heat dissipating device disposed in a laptop to form a dustproof device for the same, wherein the heat dissipating device is disposed on a main computing unit in an interior of the laptop; the heat dissipating device includes a fan set and a heat dissipating fin. The fan set includes a housing, a rotating section and a guiding device, wherein on a lateral side of the housing is disposed an opening, the rotating section is disposed inside the housing, the guiding device is disposed inside the housing between the rotating section and a lateral side of the (Continued)

opening, and a dust removing path is formed between the guiding device and an inner wall surface of the housing adjacent to the guiding device. The heat dissipating fin is correspondingly disposed on the opening of the fan set, and an indented section is disposed in the heat dissipating fin in correspondence with the dust removing path to allow dust to be blown out of the laptop through the indented section while the laptop is performing dust removal without a need to dispose a dust removing hole on the housing of the laptop.

9 Claims, 6 Drawing Sheets

(58) Field of Classification Search
CPC .................. H05K 7/20; H05K 7/20136; H05K 7/20181; B01D 46/10; B01D 46/40
See application file for complete search history.

(56) References Cited

U.S. PATENT DOCUMENTS

| | | | |
|---|---|---|---|
| 10,876,548 B2* | 12/2020 | Ting | F04D 29/023 |
| 2006/0039113 A1* | 2/2006 | Cheng | H01L 23/427 |
| | | | 361/700 |
| 2008/0219838 A1* | 9/2008 | Kusano | F04D 29/5813 |
| | | | 415/203 |
| 2009/0009967 A1* | 1/2009 | Nishizawa | F04D 27/004 |
| | | | 361/695 |
| 2009/0147477 A1* | 6/2009 | Chao | G06F 1/203 |
| | | | 361/697 |
| 2011/0097195 A1* | 4/2011 | Horng | F04D 29/4226 |
| | | | 415/121.2 |
| 2011/0267777 A1* | 11/2011 | Oike | H01L 23/467 |
| | | | 361/697 |
| 2013/0016473 A1* | 1/2013 | Ito | B08B 1/00 |
| | | | 361/679.54 |
| 2013/0177402 A1* | 7/2013 | Horng | F04D 25/0633 |
| | | | 415/121.2 |
| 2014/0118939 A1* | 5/2014 | Lin | F04D 25/0613 |
| | | | 361/695 |
| 2015/0016061 A1* | 1/2015 | Wang | F04D 29/703 |
| | | | 361/697 |
| 2017/0152864 A1* | 6/2017 | Lin | F04D 29/582 |
| 2017/0184129 A1* | 6/2017 | He | F04D 29/281 |

OTHER PUBLICATIONS

Li et al., Dust Removing Fan and Electronic Device, 2015, PE2E search engine, CN204226276 translation (Year: 2015).*

* cited by examiner

DUSTPROOF DEVICE FOR LAPTOPS

BACKGROUND OF THE INVENTION

1. Field of the Invention

The present invention relates to a dustproof device for laptops, and relates particularly to a constructional arrangement of a dustproof device for laptops that does not require disposition of a dust removing outlet on a housing of a laptop.

2. Description of Related Art

In prior art, it is known to dispose a dust removing outlet at a back of a housing of a laptop for removing dust, which spoils the overall visual aesthetics of the housing. In addition, in a dust removing method according to prior art, it is also required to dispose a dust removing hole on a housing of a fan apparatus, which greatly impairs the performance of the fan apparatus. Furthermore, besides the disadvantage of its complicated mechanical design, a dust removing outlet disposed at a back of a housing of a laptop according to prior art is located too near the fan apparatus and is therefore liable to suck dust back in. More importantly, according to the safety regulations for laptops, an outlet disposed on a housing of a laptop allows foreign matters or fluid to easily get into the laptop and cause damage to the internals, which is a disadvantage that needs to be improved.

SUMMARY OF THE INVENTION

The present invention provides a dustproof device for laptops, which improves on the foregoing disadvantages such as a need to dispose a dust removing hole, to effectively enhance the performance of a fan apparatus in compliance with the safety regulations for laptops, to keep intact the overall visual aesthetics of a housing, and to prevent entrance of foreign matters.

A dustproof device for laptops according to the present invention comprises a heat dissipating device disposed in a laptop to form a dustproof device for the same; the heat dissipating device is disposed on a main computing unit; the heat dissipating device includes a fan set and a heat dissipating fin; wherein the fan set is disposed to provide heat dissipating wind force and dust removing wind force and comprises: a housing having an opening disposed on a lateral side thereof; a rotating section disposed inside the housing, wherein on a side of the housing that accommodates the rotating section is correspondingly disposed a cutout section; and a guiding device disposed inside the housing between the rotating section and a lateral side of the opening, wherein a dust removing path is formed between the guiding device and an inner wall surface of the housing adjacent to the guiding device; further, the heat dissipating fin is correspondingly disposed at the opening to conduct heat generated by the main computing unit out of the laptop by means of the heat dissipating wind force; and an indented section is disposed in the heat dissipating fin in correspondence with the dust removing path to allow dust to be blown out of the laptop through the indented section while the laptop is performing dust removal.

To further understand the features and technical content of the present invention, please refer to the detailed description given herein below and the accompanying figures, which are given by way of illustration only and thus are not limitative of the present invention.

DETAILED DESCRIPTION OF THE PREFERRED EMBODIMENTS

The present invention provides a dustproof device for laptops having a design structure that allows dust to be blown out of a tail end of an existing air outlet without a need to dispose another outlet on the housing despite the safety regulations; further disposition of an indented section on a tail end of a heat dissipating fin may allow dust to be blown out, while a front end of the heat dissipating fin remains in compliance with the safety regulations; in addition, as the dust removing outlet is hidden from sight, the appearance of the laptop remains intact when viewed from a lateral side.

The following is further description of various exemplary embodiments in conjunction with the accompanying figures, in which are shown some exemplary embodiments. However, the concepts of the present invention may be embodied in various forms and are not to be considered as limited to the exemplary embodiments described herein. To be exact, these exemplary embodiments are provided to describe the present invention in a more detailed and comprehensive manner and to fully convey the range of the concepts of the present invention to those ordinarily skilled in the art. In the accompanying figures, the size of a device or relative sizes of devices may be exaggerated for the purpose of clarity; besides, similar numbers always refer to similar elements.

It is to be understood that technical terms such as "above," "below," "left side," "right side," "front end," "rear end," "middle" or "bottom," etc. may be used herein to describe the positions of various elements, but the positioning of these elements is not to be limited by these technical terms. They are used to clearly distinguish one element from another and their relative positions in various arrangements. Therefore, an element disposed on a left side (or front end) may be referred to as an element disposed on a right side (or rear end) without departing from the scope of the concepts of the present invention; likewise, "above," "below", "upper side" or "lower side" may be used herein merely to illustrate a relative position and not necessarily to indicate an up-down relation of elements. Technical terms such as "first" or "second" are used herein merely to clearly distinguish one element from another and not necessarily to indicate a particular sequential relation. A technical term such as "and/or" includes any and all combinations of one or more of the associated items being listed. The technical term "at least one" indicates the possibility of one, two, three, or four, etc. Further, the technical term "a plurality of" may be used herein to describe multiple elements, but implementation of the described technology is not limited to a number of two, three or four or more than four elements.

Figure 1:
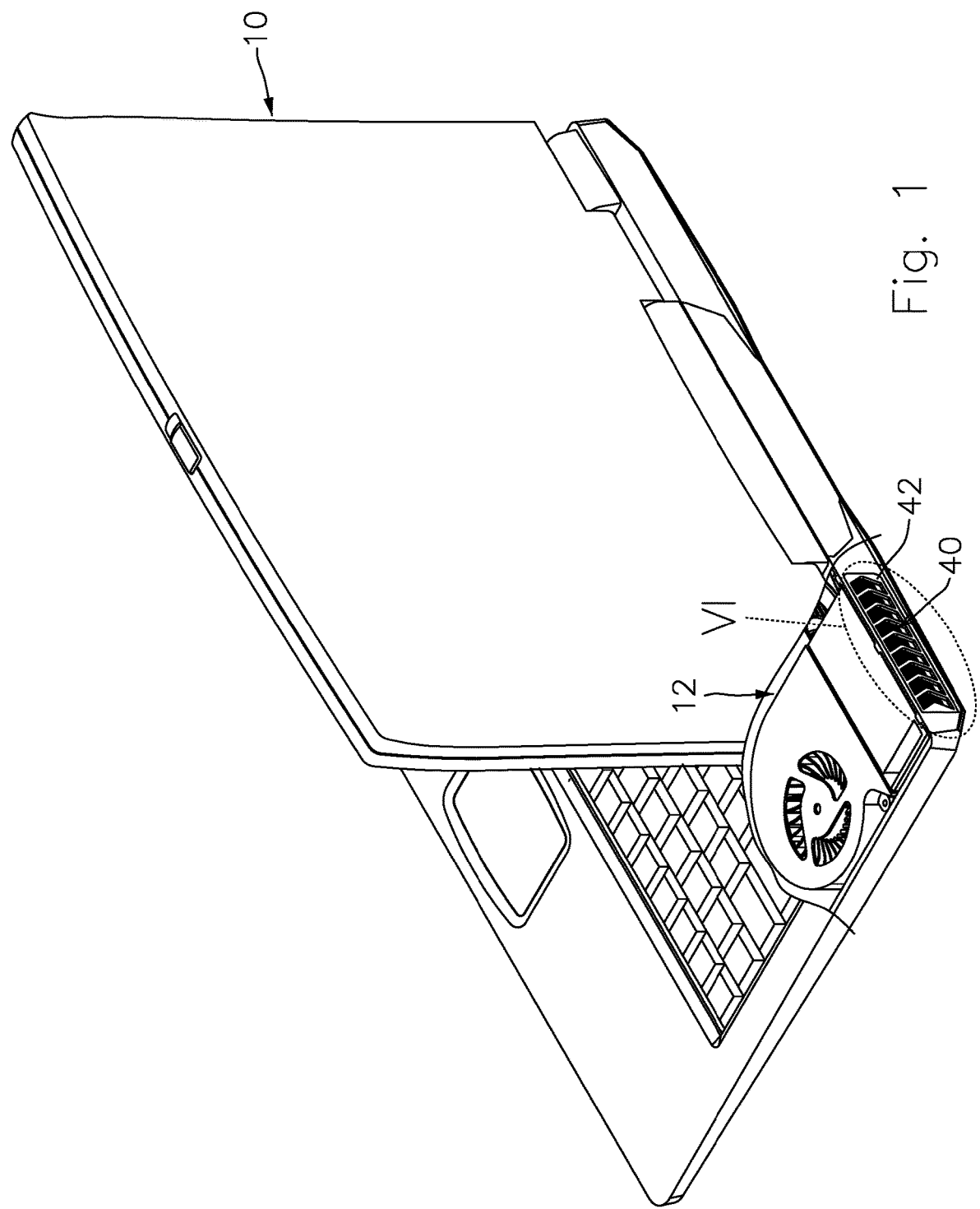
FIG. 1 is a schematic structural view of an exemplary embodiment according to the present invention implemented in a laptop.

As FIG. 1 shows, in an exemplary embodiment, a dustproof device for laptops according to the present invention is disposed in a laptop 10 and comprises a heat dissipating device 12 disposed or installed in the laptop 10 to form a dustproof device for laptops according to the present invention; further, the heat dissipating device 12 is disposed on a main computing unit (not shown in FIG. 1) in an interior of the laptop 10. The foregoing main computing unit is a central processing unit (CPU), a microcontroller unit (MCU) or a graphics processing unit (GPU) in a conventional laptop 10 that needs heat dissipation.

Figure 2:
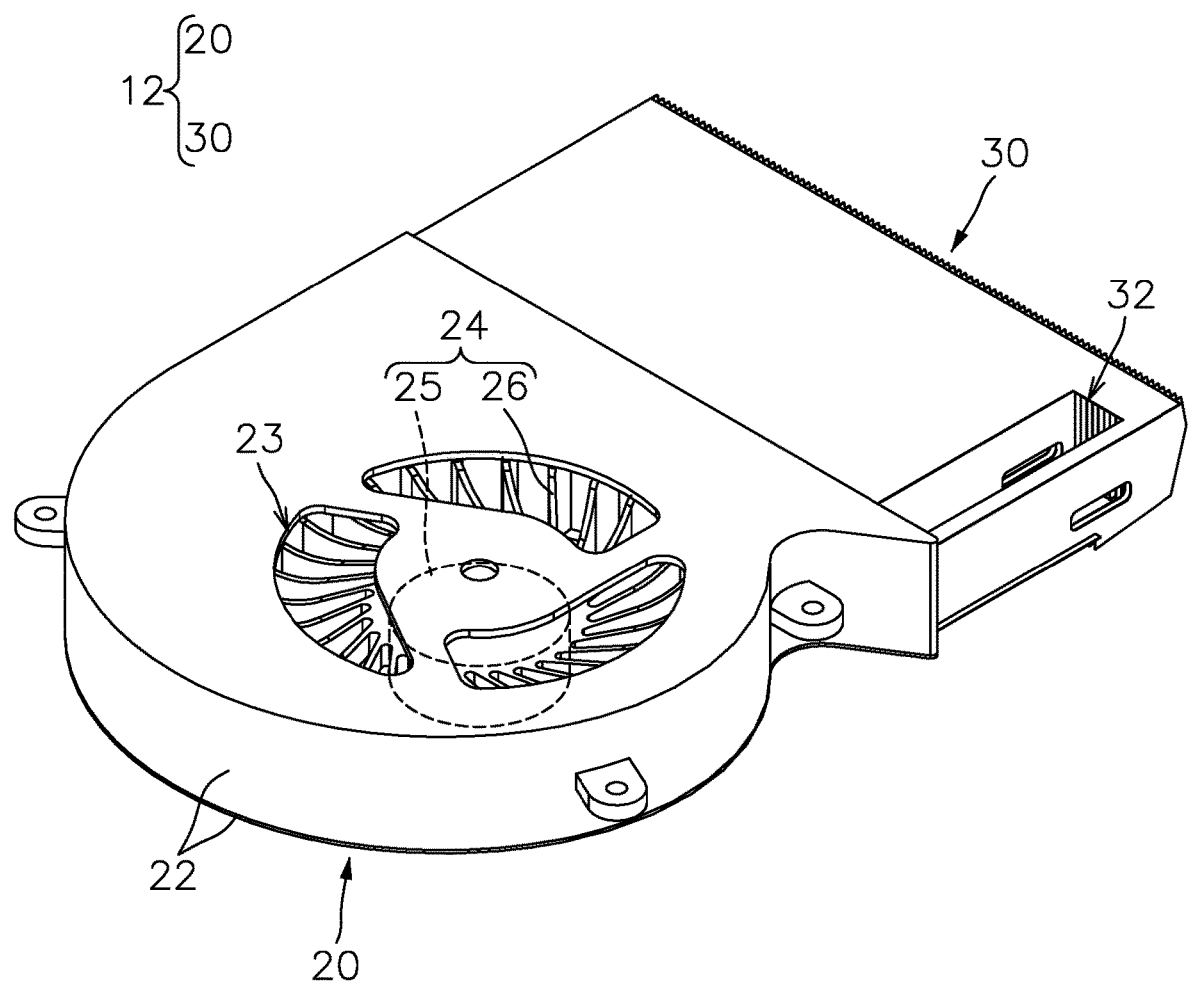
FIG. 2 is a schematic perspective view of an exemplary embodiment according to the present invention.
Figure 3:
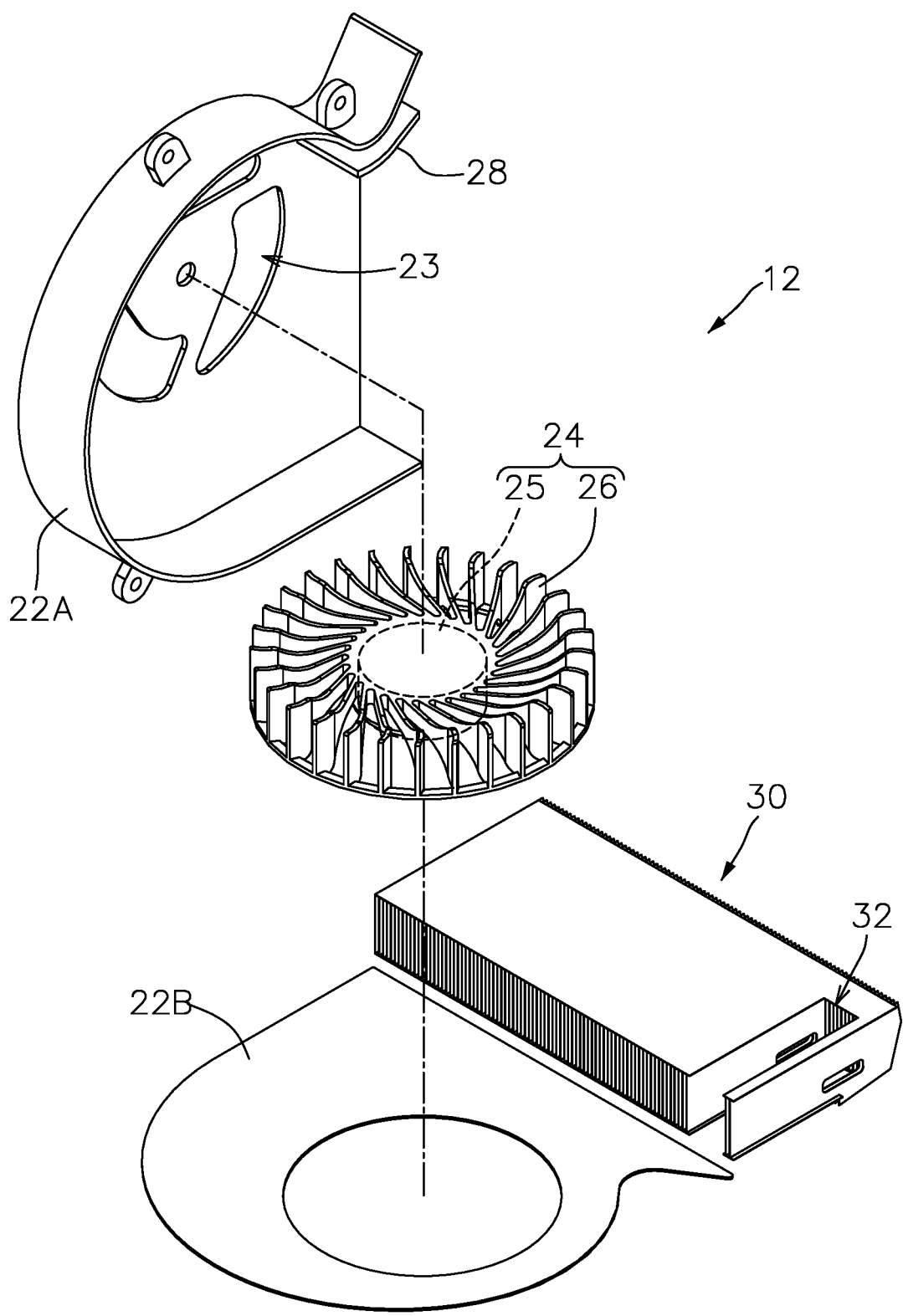
FIG. 3 is a schematic perspective view of an exemplary embodiment according to the present invention from another angle.
Figure 4:
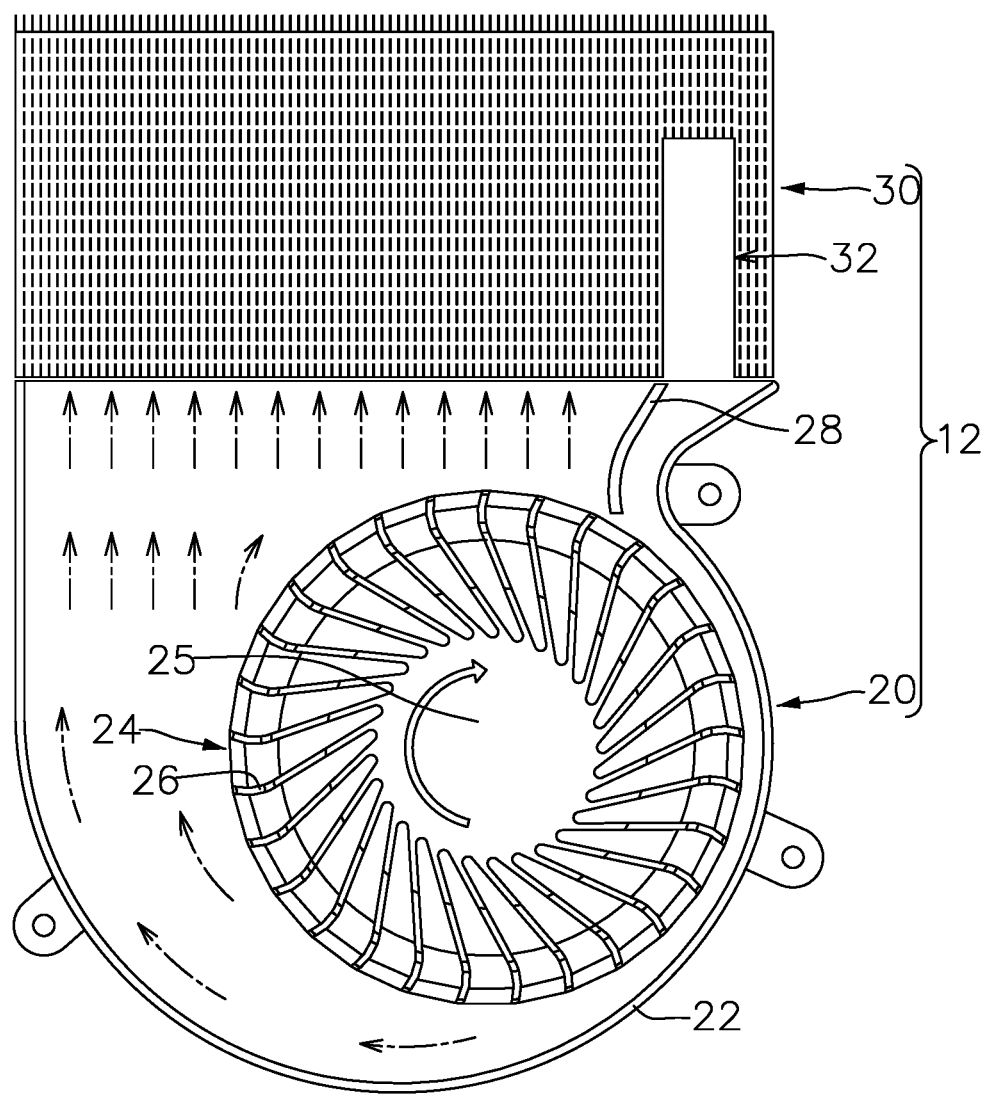
FIG. 4 is a schematic view of an exemplary embodiment according to the present invention performing heat dissipation.
Figure 5:
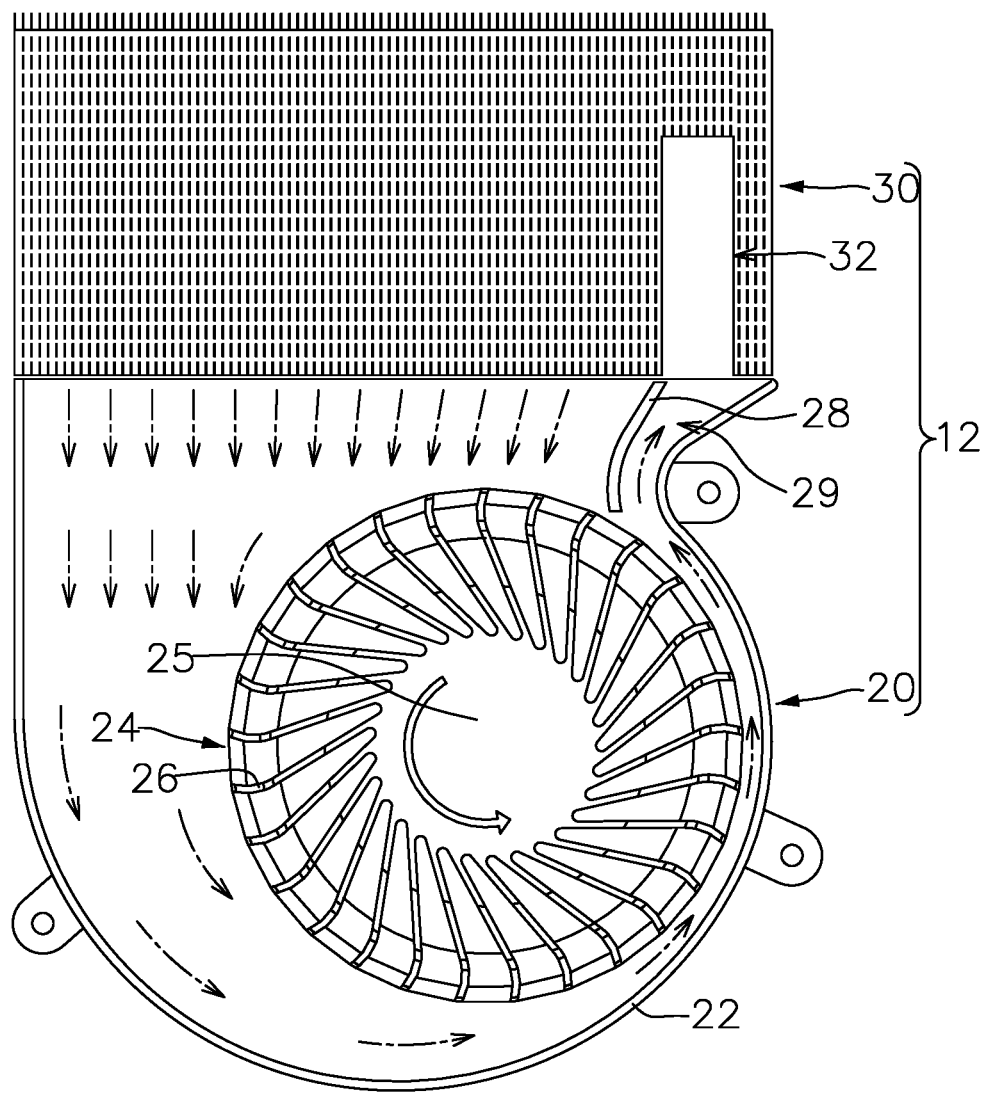
FIG. 5 is a schematic view of an exemplary embodiment according to the present invention performing dust removal.

Please refer to FIGS. 2 and 3. The heat dissipating device 12 includes a fan set 20 and a heat dissipating fin 30. The fan set 20 is disposed to provide heat dissipating wind force (as the dotted lines in FIG. 4 show) and dust removing wind force (as the dotted lines in FIG. 5 show) and comprises a housing 22 and a rotating section 24; the housing 22 is formed by assembling an upper cover 22A and a lower cover 22B, and on a lateral side of the housing is disposed an opening that faces a heat dissipating direction of the heat dissipating fin 30 to facilitate heat dissipation. On a side of the upper cover 22A of the housing 22 that accommodates the rotating section 24 is correspondingly disposed a cutout section 23, as FIG. 3 shows.

The rotating section 24 as shown in FIG. 3 comprises a motor 25 in combination with a blade assembly 26, wherein the motor 25 is located at a central position of the rotating section 24 for providing the fan set 20 with the power source required to rotate the blade assembly 26 to produce wind force; the blade assembly 26 is disposed at an outer periphery of the motor 5 so that the blade assembly 26 may be driven by the motor 25 to rotate and produce the required heat dissipating wind force or dust removing wind force. As FIG. 3 shows, the fan set 12 according to the present invention also includes a guiding device 28. The guiding device 28 is disposed inside the housing 22 between the rotating section 24 and a lateral side of the opening, so that a dust removing path 29 (as shown in FIG. 5) is formed between the guiding device 28 and an inner wall surface (e.g. the upper cover 22A) of the housing 22 adjacent to the guiding device 28. In actual practice, the guiding device 28 is a curved sheet body in structure, and the foregoing dust removing path 29 is formed between the structure of this curved sheet body and an inner wall surface (e.g. the upper cover 22A) of the housing 22 adjacent to this curved sheet body.

The dissipating fin 30 according to the present invention is correspondingly disposed on the opening of the fan set 20 to conduct heat generated during the operation of the foregoing main computing unit of the laptop 10 out of the laptop 10 by means of the foregoing heat dissipating wind force; and an indented section 32 is disposed in the heat dissipating fin 30 in correspondence with the dust removing path 20 (as shown in FIGS. 2 and 3) to allow dust to be blown out of the laptop 10 through the indented section 32 while the laptop 10 is performing dust removal. The foregoing indented section 32 is formed by indenting a side edge of the heat dissipating fin 30 inward to form an indentation. In actual practice, the indentation has a U-shaped or square-shaped structure.

Please refer to FIGS. 4 and 5. Between an outer edge of the rotating section 24 and an inner wall surface of the housing 22 (e.g. the upper cover 22A) is a conducting path shaped as an arc, as the dotted lines in FIG. 4 show. The conducting path has a first direction (as the arrows of the dotted lines in FIG. 4 show) and a second direction (as the arrows of the dotted lines in FIG. 5 show). That is, when the fan set 20 generates heat dissipating wind force, the first direction is a conducting direction of the wind force which is generated by the rotation of the blade assembly 26 when driven by the motor 25. That is, the direction of the dotted lines in FIG. 4 is primarily a direction in which the heat generated by the computing unit in the laptop 10 is blown out of the laptop 10 by means of the heat dissipating fin 30. The second direction refers to the direction in which the wind is conducted when the fan set 20 generates dust removing wind force, i.e. the direction of the dotted lines in FIG. 5. The first direction and the second direction are obviously in reverse directions. Further, the dust removing wind force will blow towards the indented section 32 in the heat dissipating fin 30 via the dust removing path 29 and remove dust from the laptop 10.

Figure 6:
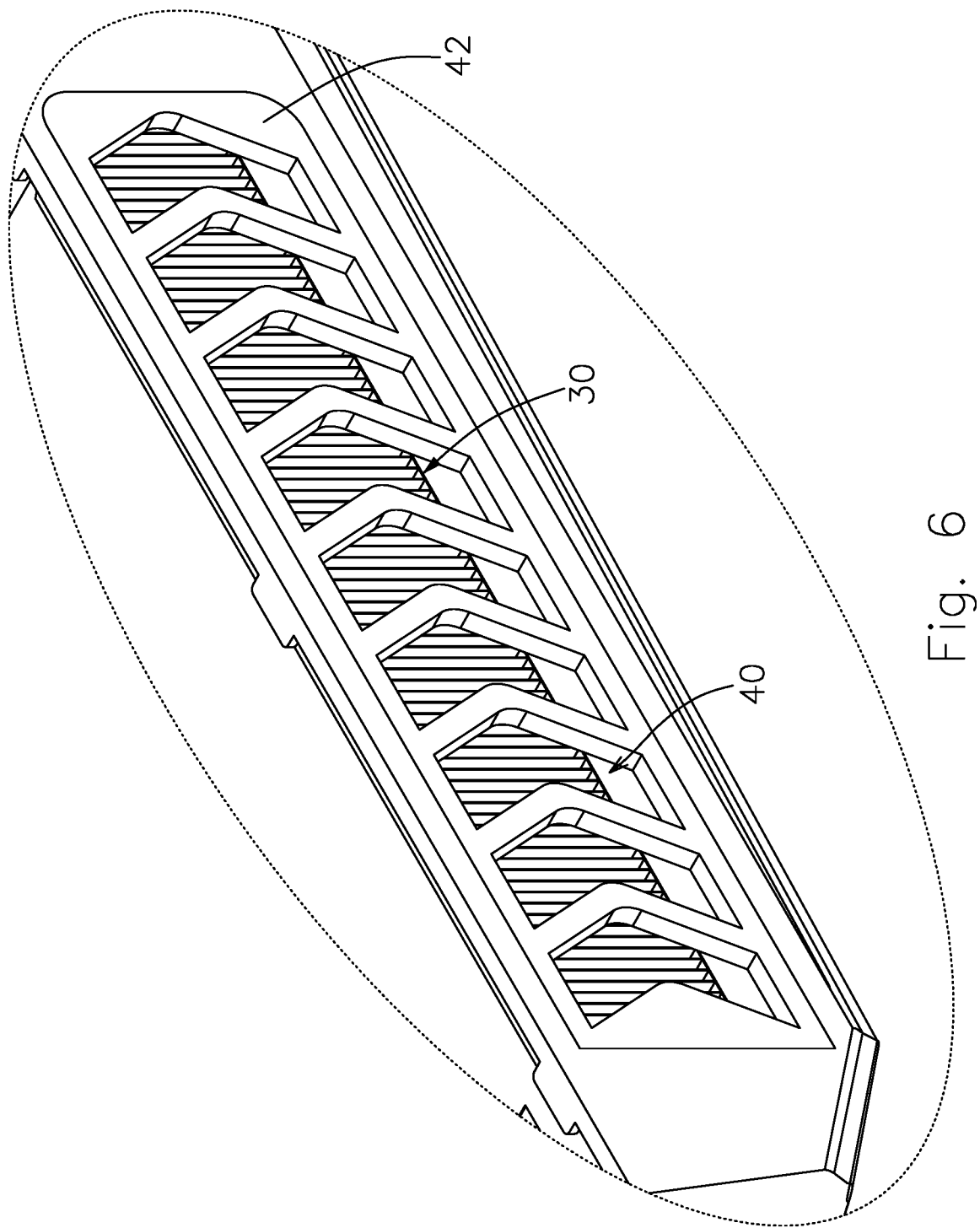
FIG. 6 is a schematic view of an air outlet implemented in an exemplary embodiment according to the present invention.

As FIG. 6 shows, on a lateral side of the housing of the laptop 10 in correspondence with the heat dissipating fin 30 is disposed an air outlet 40. Please also refer to FIG. 1 for the location of the air outlet 40 in relation to the laptop 10. However, the location of the air outlet 40 as FIG. 1 shows is only an exemplary embodiment. The air outlet 40 may be disposed on any side of a periphery of the laptop 10, in which cases the location of the heat dissipating fin 30 will also be adjusted accordingly. Therefore, the scope of implementation of the present invention should not be limited to the exemplary embodiment described herein. In addition, on the housing of the laptop 10 in correspondence with the air outlet 40 is disposed a cover body 42. As FIGS. 1 and 6 show, correspondingly, the heat dissipating fin 30 is disposed in correspondence with an interior of the air outlet 40. With the element structures provided in the present invention, the appearance of a conventional laptop may remain intact when viewed from the air outlet 40 on a lateral side of the laptop. With the dust removing outlet (referring to the foregoing indented section 32) hidden in an interior of a laptop, the prior art that requires disposition of an outlet is improved.

In view of the foregoing, with an indented section 32 disposed in the heat dissipating fin 30 and a guiding device 28, the present invention has a design structure that allows dust to be blown out of a tail end of an existing air outlet without a need to dispose another outlet on the housing despite the safety regulations. Further, disposition of an indented section 32 on a tail end of a heat dissipating fin 30 may allow dust to be blown out, while a front end of the heat dissipating fin 30 remains in compliance with the safety regulations. When viewed from a lateral side, the appearance of the laptop 10 may remain intact with the heat dissipating device 12 hidden from sight as being disposed in an interior of the laptop 10.

However, the foregoing preferred embodiments of the present invention are illustrated of the present invention rather than limiting of the present invention. They are intended to cover various local modifications and minor changes or additions or changes in numbers or positions included within the spirit and scope of the appended claims, the scope of which should be accorded the broadest interpretation so as to encompass all such modifications and similar structures.

What is claimed is:

1. A dustproof device for laptops, comprising a heat dissipating device disposed in a laptop to form the dustproof device for the same; the heat dissipating device is disposed on a main computing unit in an interior of the laptop; the heat dissipating device includes:
- a fan set for providing heat dissipating wind force and dust removing wind force, comprising:
  - a housing having an opening disposed on a lateral side thereof;
  - a rotating section disposed inside the housing, wherein on a side of the housing that accommodates the rotating section is correspondingly disposed a cutout section; and
  - a guiding device disposed inside the housing between the rotating section and a lateral side of the opening, wherein a dust removing path is formed between the guiding device and an inner wall surface of the housing adjacent to the guiding device, wherein the guiding device is a curved sheet body in structure, and the rotating section is arranged adjacent to the guiding device;
- a heat dissipating fin correspondingly disposed on the opening of the fan set to conduct heat generated during the operation of the main computing unit of the laptop out of the laptop by means of the heat dissipating wind force; and an indented section disposed in the heat dissipating fin and aligned with the dust removing path to allow dust to be blown out of the laptop through the indented section while the laptop is performing dust removal;
- wherein the indented section passes from a top of the heat dissipating fin to a bottom of the heat dissipating fin.

2. The dustproof device for laptops of claim 1, wherein the indented section is formed by indenting a side edge of the heat dissipating fin inward to form an indentation, which has a U-shaped or square-shaped structure.

3. The dustproof device for laptops of claim 1, wherein the dust removing path is formed between the guiding device that is the curved sheet body in structure and the inner wall surface of the housing adjacent to the guiding device that is the curved sheet body in structure.

4. The dustproof device for laptops of claim 1, wherein between an outer edge of the rotating section and the inner wall surface of the housing is a conducting path shaped as an arc, which has a first direction and a second direction.

5. The dustproof device for laptops of claim 4, wherein the first direction is a conducting direction of the heat dissipating wind force generated by the fan set; the second direction is a conducting direction of the dust removing wind force generated by the fan set; the first direction and the second direction are in reverse directions, and the dust removing wind force will blow towards the indented section in the heat dissipating fin via the dust removing path and remove dust from the laptop.

6. The dustproof device for laptops of claim 1, wherein the main computing unit is a central processing unit (CPU), a microcontroller unit (MCU) or a graphics processing unit (GPU).

7. The dustproof device for laptops of claim 1, wherein on a lateral side of a housing of the laptop in correspondence with the heat dissipating fin is disposed an air outlet.

8. The dustproof device for laptops of claim 1, wherein on the housing of the laptop in correspondence with the air outlet is disposed a cover body.

9. The dustproof device for laptops of claim 5, wherein the rotating section includes:
- a motor located at a central position of the rotating section for providing the fan set with the power source required to produce wind force;
- a blade assembly disposed at an outer periphery of the motor to be driven by the motor to rotate and produce the required wind force.

* * * * *